United States Patent [19]
Yang et al.

[11] Patent Number: 6,159,794
[45] Date of Patent: Dec. 12, 2000

[54] METHODS FOR REMOVING SILICIDE RESIDUE IN A SEMICONDUCTOR DEVICE

[75] Inventors: Wenge Yang, Fremont; Lewis Shen, Cupertino, both of Calif.

[73] Assignee: Advanced Micro Devices, Inc., Sunnyvale, Calif.

[21] Appl. No.: 09/076,662

[22] Filed: May 12, 1998

[51] Int. Cl.[7] .................................................. H01L 21/336
[52] U.S. Cl. ......................... 438/257; 438/714; 438/738; 438/637; 438/700; 438/711; 156/653
[58] Field of Search ...................................... 438/637, 638, 438/636, 700, 710, 711, 714, 734, 721, 738; 156/653

[56] References Cited

U.S. PATENT DOCUMENTS

| | | |
|---|---|---|
| 5,094,712 | 3/1992 | Becker et al. . |
| 5,160,407 | 11/1992 | Latchford et al. . |
| 5,167,762 | 12/1992 | Carr et al. . |
| 5,169,487 | 12/1992 | Langley et al. . |
| 5,219,485 | 6/1993 | Wang et al. . |
| 5,242,536 | 9/1993 | Schoenborn . |
| 5,271,799 | 12/1993 | Langley . |
| 5,368,684 | 11/1994 | Ishikawa et al. . |
| 5,487,811 | 1/1996 | Iizuka . |
| 5,702,564 | 12/1997 | Shen . |
| 5,908,791 | 5/1996 | Han et al. . |
| 5,948,703 | 9/1999 | Shen et al. . |

*Primary Examiner*—John F. Niebling
*Assistant Examiner*—Jonathan Hack

[57] ABSTRACT

A multistage etching process is provided for etching through portions of a layer stack during the formation of a control gate in a semiconductor device. The multistage etching process allows for controlled removal of a tungsten silicide layer within the layer stack by reducing the potential for loading, microloading, over-etching, under-etching, etc. In a first stage of the multistage etching process, part of the tungsten silicide layer is selectively etched away using a plasma that exhibits an etching selectivity (ratio of tungsten silicide etch rate to polysilicon etch rate) less than about 1.2. During the second stage of the multistage etching process, the remaining amount and/or residue parts of the tungsten silicide layer is selectively etched away using a plasma that exhibits an etching selectivity (ratio of tungsten silicide etch rate to polysilicon etch rate) greater than about 1.2.

19 Claims, 4 Drawing Sheets

METHODS FOR REMOVING SILICIDE RESIDUE IN A SEMICONDUCTOR DEVICE

RELATED APPLICATIONS

This application is related to co-pending application Ser. No. 09/076,663 (Attorney Docket number 50100-542), filed May 12, 1998, entitled Methods For Preventing Silicide Residue Formation In A Semiconductor Device.

TECHNICAL FIELD

The present invention relates to semiconductor devices and manufacturing processes, and more particularly to methods associated with selectively removing a silicide residue that forms in certain semiconductor devices during fabrication.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit-line and a word-line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1a. As shown, memory cell 8 is viewed in a cross-section through the bit-line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1b depicts a cross-section of several adjacent memory cells from the perspective of a cross-section through the word line (i.e., from perspective II, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a portion of a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon deposited over the exposed portions of substrate 12, tunnel oxide 15, and field oxides 14a–b. Interpoly dielectric layer 24 has been conformally deposited over the exposed portions of floating gates 16a–c and field oxide regions 14a–b. Interpoly dielectric layer 24 isolates floating gates 16a–c from the next conformal layer which is typically a polysilicon layer that is subsequently patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer.

Control gate 26, which is one of a plurality of control gate structures, is formed over interpoly dielectric layer 24 by depositing a layer of polysilicon on interpoly dielectric layer 24. Next, silicide layer 28 is formed on interpoly dielectric 24. Additional layers of material may also be deposited over silicide layer 28, such as, cap layer 30, and one or more dielectric layers 32 and 33, for example. Cap layer 30 is typically a layer of polysilicon that reduces stress in the silicide layer 28. Dielectric layers 32 and 33 typically include silicon dioxide, silicon oxynitride and/or silicon nitride, which are formed using conventional deposition techniques. The resulting layers are then selectively patterned to form control gate structures.

The shrinking of semiconductor devices, and in particular the features depicted in the memory cells of FIGS. 1a–b, places a burden on the fabrication processes, because the shape, size and location of floating and control gate structures are of fundamental importance to the memory cell. In certain reduced size semiconductor devices, such as, for example, the memory cells in FIGS. 1a–b, selective etching processes can cause a silicide residue to form during the etching away of selected portions of silicide layer 28. This silicide residue hinders the subsequent etching of the underlying layer, for example, an underlying layer of polysilicon. Thus, there is a need for methods for controlling the formation processes, such as a control gate etching process, to effectively remove silicide residue during fabrication.

SUMMARY OF THE INVENTION

In accordance with certain aspects of the present invention, it has been found that, for certain semiconductor devices, the underlying floating gates and/or other structures tend to cause varying thickness in the overlying layers, for example, an overlying polysilicon layer and subsequently formed silicide layer. This varying thickness can present problems during the formation of the device features that are formed from these overlying layers. For example, a silicide residue can form during the selective etching of the silicide layer in regions where the silicide is thicker.

In accordance with other certain aspects of the present invention, it has been found that certain silicide layers, such as, for example, a tungsten silicide layer, are not necessarily homogeneous and that differing concentrations of the refractory or near noble metal used to form the silicide, for example, tungsten, can affect the etching process during formation of the control gate structures. For example, higher concentrations of tungsten towards the bottom of the silicide layer can lead to the formation of silicide residue.

As such, improved methods are needed to effectively control the patterning of a silicide layer and/or the underlying layer(s) to account for varying thickness', non-homogeneous materials, etching rates, and other concerns (e.g., loading, microloading, over/under-etching, etc.), which are exacerbated by the shrinkage of the semiconductor device's features.

The above-stated needs and others are met by the present invention, which provides methods that increase the process control during the fabrication of semiconductor devices by removing the silicide residue that tends to form during the selective etching of a silicide material.

Thus, in accordance with certain embodiments of the present invention, a method for fabricating a semiconductor device is provided. The method includes forming a first gate structure on a substrate, forming at least one dielectric material on the first gate structure and forming a layer stack on the dielectric material. The layer stack includes at least a second gate material that is formed on the dielectric material and a silicide that is formed on the second gate material. The method further includes selectively removing a portion of the layer stack using a first plasma followed by a second plasma, so as to expose a portion of the underlying dielectric material. By way of example, the second gate material can be polysilicon and the silicide can be a tungsten silicide. As such, in certain embodiments of the present invention, the first plasma exhibits an etching rate selectivity of tungsten silicide to polysilicon that is less than about 1.2, and the second plasma exhibits an etching rate selectivity of tungsten silicide to polysilicon that is greater than about 1.2. The increased selectivity allows for the removal of silicide residue that can form during fabrication.

In accordance with still other embodiments of the method above, the step of selectively removing a portion of the layer stack is conducted in-situ using an etching tool that has an adjustable source power supply and an adjustable bias power supply. At least one of the adjustable power supplies is adjusted to generate the second plasma from the first plasma. Adjusting one or more of the power supplies allows the physical etching capability of the second plasma to be increased without changing the etchant chemistry of the first plasma. With its increased sputtering capability, the second plasma is more efficient in removing silicide residue, than is the first plasma. In certain embodiments of the present invention, the etchant chemistry is the same for both the first and second plasmas and includes a mixture of $Cl_2/N_2/He-O_2$ gasses.

In accordance with yet another embodiment of the present invention, a method is provided for etching through a silicide during fabrication of a semiconductor device. The method includes etching into selected portions of the silicide at a first etching rate, and then etching through the silicide at a second etching rate, which is faster than the first etching rate.

The above stated needs are also met by an in-situ multistage etching method for removing silicide in a semiconductor device during fabrication within an etching tool, in accordance with still other embodiments of the present invention. This method includes etching the silicide at a first rate during a first stage, adjusting an amount of electrical energy that is provided to an etchant mechanism generated within the etching tool to raise the etching rate to a second rate higher than the first rate, and etching the silicide at the second rate during a second stage.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 2:
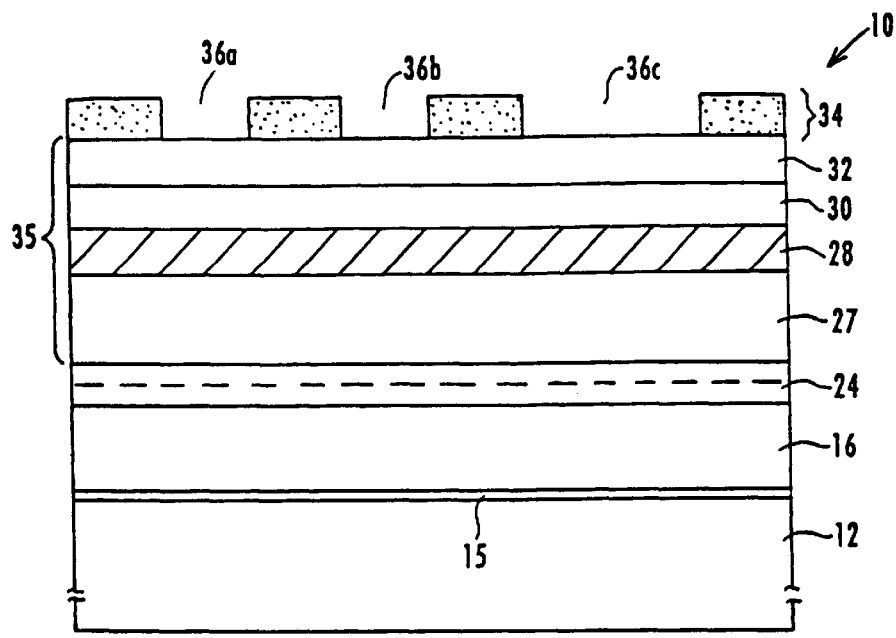
FIG. 2 depicts a cross-sectional view of a portion of a semiconductor device having a plurality of layers, including a silicide layer and an underlying polysilicon layer, that has been prepared to be selectively etched to form a control gate structure.

FIG. 2 depicts a portion 10 of a semiconductor device having a plurality of layers that have been prepared for a selective etching process in which a control gate structure is formed. As shown, the exemplary portion in FIG. 2 includes a substrate 12, a tunnel oxide 15, a floating gate 16, an interpoly dielectric layer 24, and a layer stack 35. Layer stack 35, from which one or more control gate structures can be formed, includes a control gate polysilicon layer 27, a silicide layer 28, a cap layer 30, and a dielectric layer 32. To prepare the layer stack 35 for selective etching, a conventional photoresist mask 34, having etching windows 36a–c, is formed on dielectric layer 32.

The various layers of portion 10 are formed using conventional semiconductor fabrication techniques and tools. By way of example, the polysilicon used to form floating gate 16, control gate 26 and cap layer 30 can be deposited using conventional deposition techniques, such as, for example, chemical vapor deposition (CVD) or plasma enhanced CVD (PECVD) techniques. Similarly, the dielectric materials used to form tunnel oxide 15, interpoly dielectric 24, and dielectric layer 32 can be grown and/or deposited using conventional processes.

Layer stack 35 is typically patterned to form a control gate structure by anisotropically etching away portions of the layer stack 35 through etching windows 36a, 36b and 36c, using a patterning process that employs conventional etching techniques and tools, such as, for example, reactive ion etching (RIE) and/or plasma etching techniques and tools. This patterning process sequentially etches into the layer stack 35 and endpoints on interpoly dielectric layer 24. The photoresist mask 34 is then removed or stripped away, for example, using conventional stripping techniques, and additional layers are added to complete the semiconductor device fabrication process.

Figure 1A:
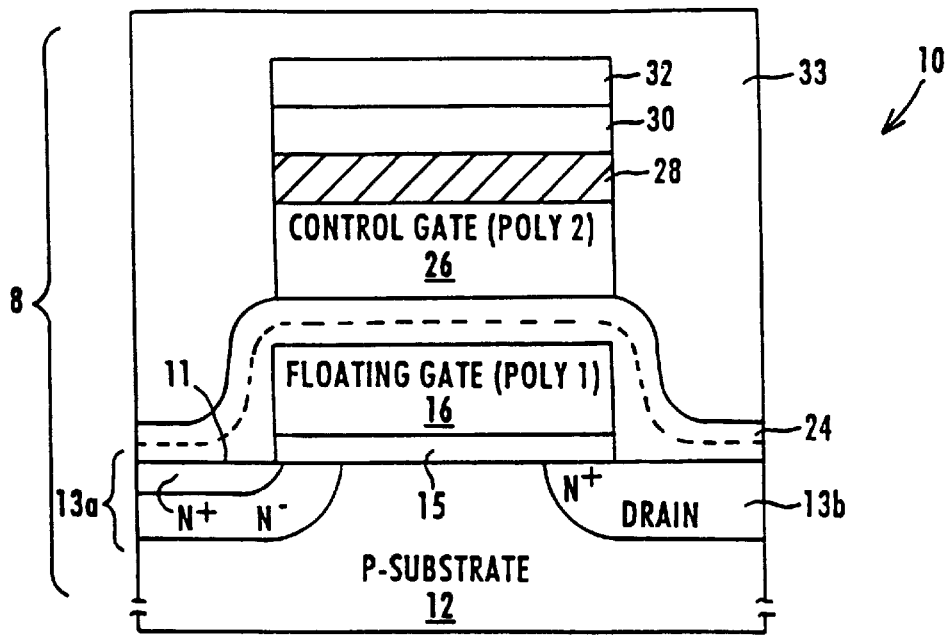
FIG. 1a depicts a cross-sectional view of a portion of a typical prior art semiconductor device having at least one memory cell, as viewed through a section along a bit-line.
Figure 1B:
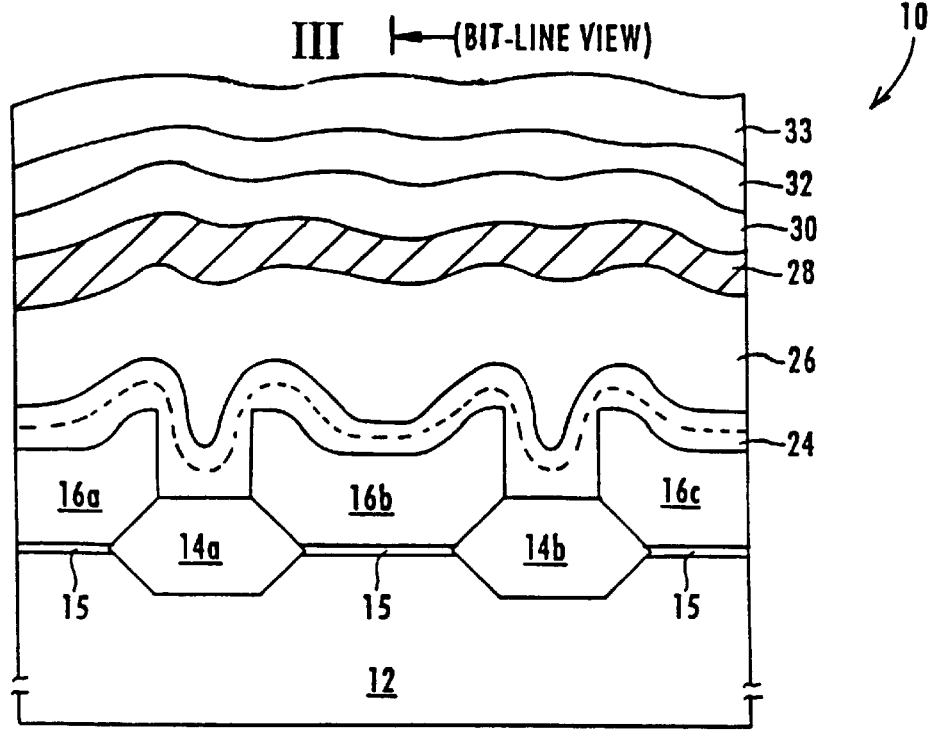
FIG. 1b depicts a cross-sectional view of a portion of a typical prior art semiconductor device having at least one memory cell, as viewed through a section along a word-line.

In accordance with certain embodiments of the present invention, floating gate 16 is typically about 900 to 1,100 Angstroms thick, and interpoly dielectric layer 24 is about 170 Angstroms thick. Interpoly dielectric layer 24 is preferably an ONO (oxide-nitride-oxide) layer that is formed, for example, by a three stage process in which a first film of silicon dioxide (e.g., about 50 Angstroms thick) is deposited or grown, followed by deposition of a second film of silicon nitride (e.g., about 80 Angstroms thick), and then a third film of silicon dioxide (e.g., about 40 Angstroms thick) is deposited or grown. The ONO layer provides a thin, highly insulating dielectric layer that separates the floating gate 16 from the control gate 26, as depicted in FIG 1a. The control gate polysilicon layer 27 is then conformally deposited on the interpoly dielectric layer 24 to an average thickness of about 1,200 Angstroms using conventional deposition techniques. Silicide layer 28, for example, tungsten silicide (e.g., $WSi_2$), is then formed on the control gate polysilicon layer 27 to a thickness of about 1,500 Angstroms. Next, cap layer 30, which is preferably a polysilicon layer, is deposited on silicide layer 28 to a thickness of about 500 Angstroms. Dielectric layer 32, which in certain embodiments is a layer of silicon dioxide, silicon nitride (e.g., SiN), or silicon oxynitride (e.g., SiON), is deposited on cap layer 30 to a thickness of about 1000 Angstroms. Note that for purposes of illustration, portion 10 in FIG. 2 has been drawn as having layers that are substantially planar and of uniform thickness, although such is not required.

Figure 3:
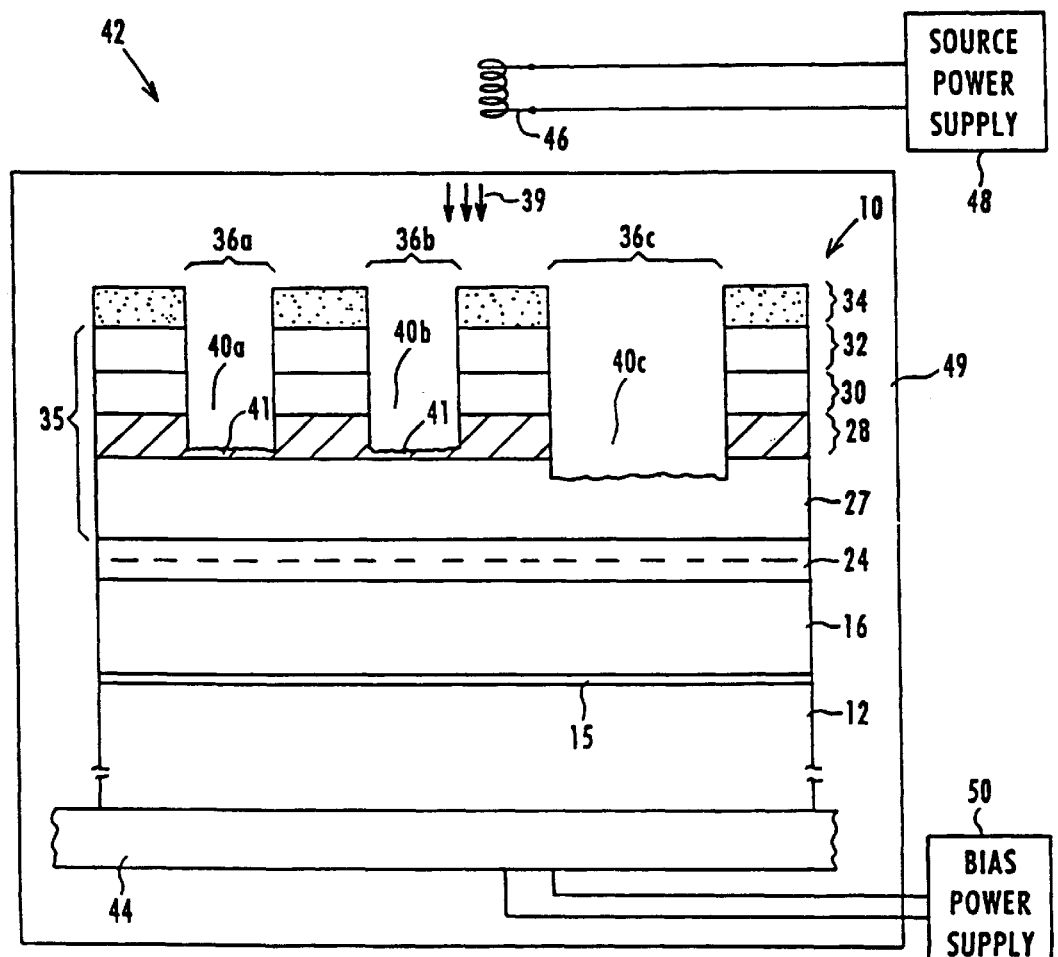
FIG. 3 depicts the portion of FIG. 2 after having been placed in an etching tool and undergoing a conventional etching process that failed to effectively remove all of the silicide layer.
Figure 4A:
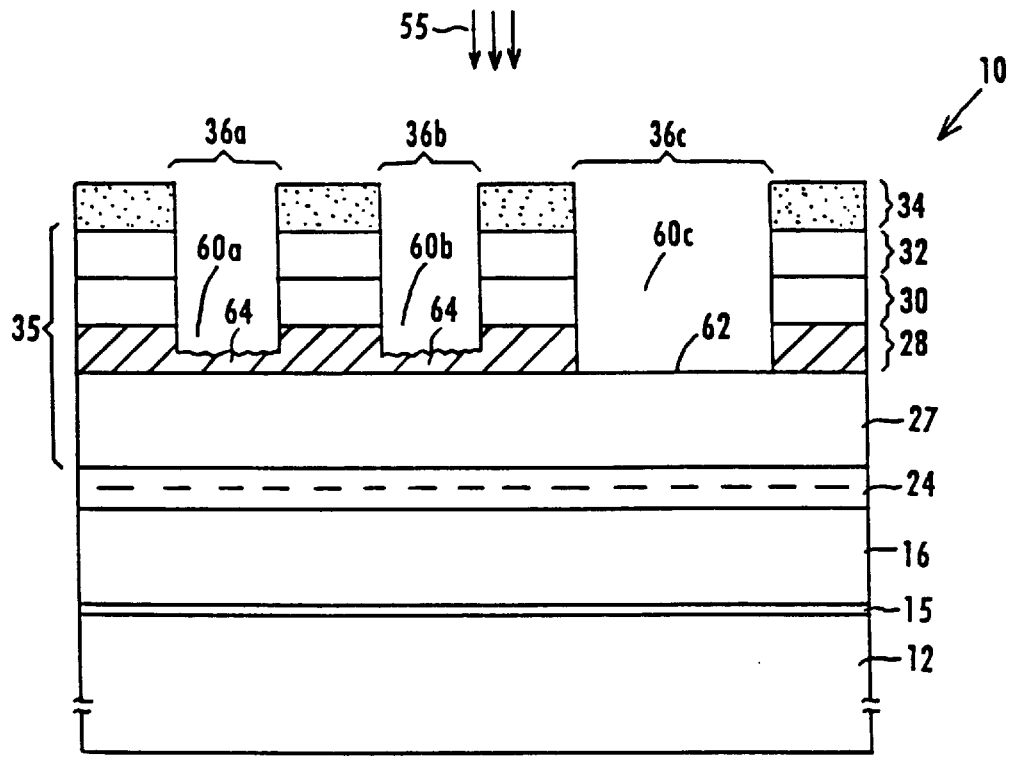
FIG. 4a depicts the portion of FIG. 2 after having been placed in an etching tool and undergoing an etching process that includes a first stage etching process, in accordance with certain embodiments of the present invention, that has removed a portion of the silicide layer.
Figure 4B:
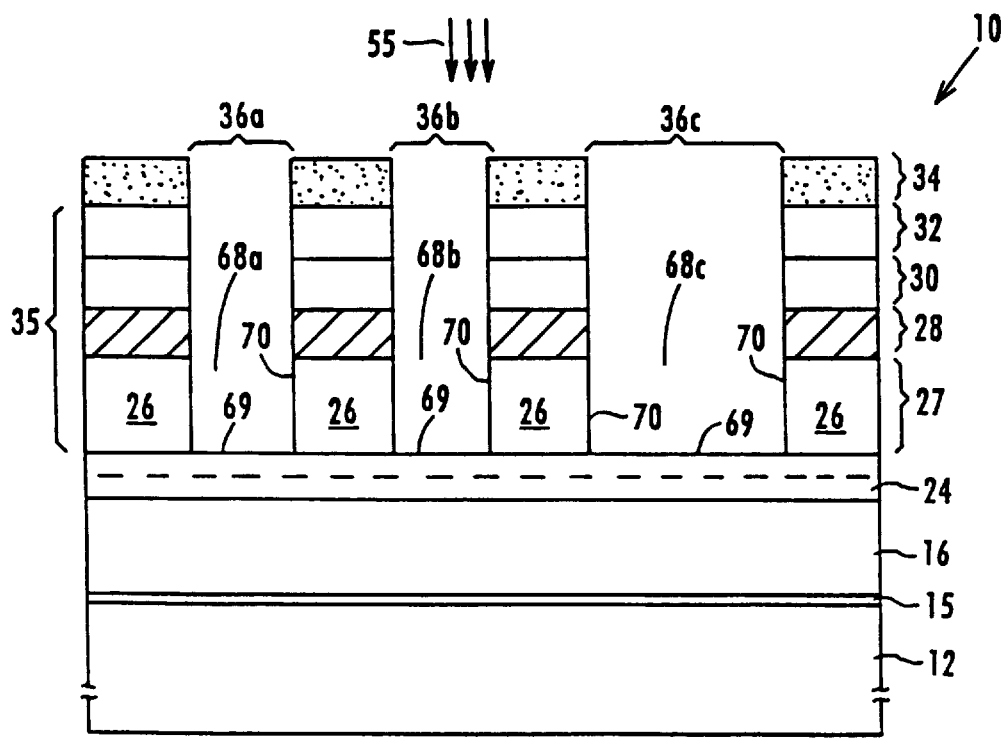
FIG. 4b depicts the portion of FIG. 4a following a subsequent second stage etching process which effectively removed the remaining selected portions of the silicide layer and the underlying polysilicon layer to complete the formation of several control gate structures, in accordance with certain embodiments of the present invention.
Figure 5:
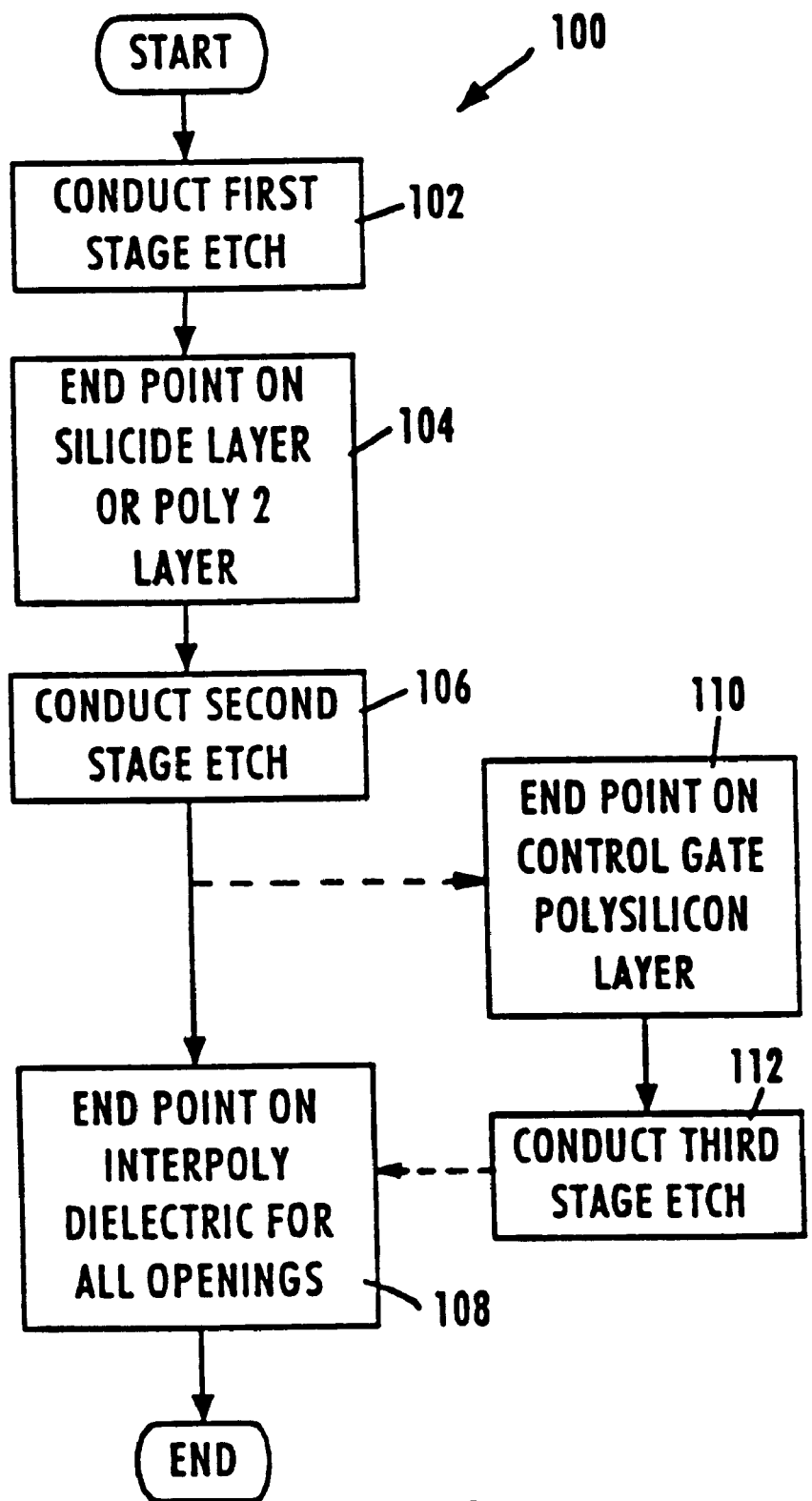
FIG. 5 is a flowchart depicting an exemplary multistage etching process that effectively removes selected portions of a silicide layer during the formation of control gate structures, in accordance with certain embodiments of the present invention.

As described below, FIG. 3 presents exemplary etching related problems that have been found to exist in certain semiconductor devices, and FIGS. 4a, 4b and 5 present exemplary solutions to these types of problems, which are associated with selective etching of the silicide layer 28 and control gate polysilicon layer 27 during formation of one or more control gate structures. As such, in the structures and methods shown in these figures it is assumed that any overlying layers of material (e.g., layers 32 and 30 in FIG. 2) have already been selectively etched using conventional etching techniques, as known in the art.

In FIG. 3, portion 10 of FIG. 2 has been placed within an etching tool 42 and exposed to a plasma 39 that is configured to etch through the silicide layer 28 and then through the control gate polysilicon layer 27. Plasma 39 is typically configured to etch through silicide layer 28 and polysilicon layer 27 at about the same rate (e.g., exhibiting a selectivity of about 1.0), in order to maintain a substantially vertical profile. As shown, plasma 39 has been used to remove exposed portions of silicide layer 28 through windows 36a, 36b and 36c, thereby forming etched openings 40a, 40b and 40c, respectively. Notice that a silicide residue 41 has formed in openings 40a and 40b. In certain embodiments, silicide residue 41 is believed to include a higher concentration of the refractory metal, e.g., tungsten, which is more difficult for plasma 39 to etch away when compared to silicide having lower concentrations of the refractory metal. Silicide residue 41 is also believed to form due to differences in the thickness of silicide layer 28. Notice, however, that etched opening 40c, which is depicted as extending into control gate polysilicon layer 27, does not, therefore, have a silicide residue. It is believed that the narrower openings of windows 36a and 36b, as compared to window 36c, and the resulting higher aspect ratios of the etched openings 40a, 40b, as compared to etched opening 40c, tends to lead to silicide residue formation due to microloading effects.

Etching tool 42, in accordance with certain exemplary embodiments, is an AMAT Decoupled Plasma Source (DPS) etcher, available from Applied Materials of Santa Clara, Calif. Etching tool 42 includes a bottom or bias electrode 44 and a top or source electrode 46. Source electrode 46 is electrically coupled to source power supply 48. Source power supply 48 is configured to output electrical energy (e.g., radio frequency (RF) energy) to the source electrode 46, which generates plasma 39 by applying an electrical field to various gasses within a reactor chamber 49. Bias electrode 44, which also serves as a chuck to hold the semiconductor wafer associated with portion 10 during etching, is electrically coupled to bias power supply 50. Bias power supply 50 is configured to output direct current (DC) electrical energy to bias electrode 44, which negatively charges the bias electrode 44 causing positively charged ions in the plasma 39 to be attracted and accelerated towards the exposed surfaces of the semiconductor wafer (e.g., portion 10).

As shown, etched openings 40a and 40b do not extend through silicide layer 28, however, etched opening 40c is already through silicide layer 28 and has etched into the control gate polysilicon layer 27. As this example demonstrates, the different etching rates associated with the formation of silicide residue 41 in etched openings 40a, 40b (and the lack thereof in etched opening 40c), present process control problems that can lead to over-etching and/or under-etching of layer stack 35 during the formation of the control gate structures. For example, in certain embodiments, if plasma is applied for a long enough period of time then etched opening 40c will extend through control gate polysilicon layer 27 and begin etching exposed portions of interpoly dielectric layer 24, while etched openings 40a and 40b will remain substantially unchanged in depth due to the relative inability of the plasma 39 to etch through silicide residue 41.

As mentioned above, it is believed that the formation of silicide residue 41 and consequently different etching rates are at least partially caused by the differences in widths of windows 36a, 36b and 36c, and/or the effectiveness of plasma 39 within the width of a particular window. For example, because windows 36a and 36b present higher aspect ratios (i.e., a ratio of height to width) than does window 36c, the effectiveness (e.g., etch rate, sputtering, etc.) of the physical attributes of plasma 39 within windows 36a and 36b appears to be reduced. Other potential causes for the formation of silicide residue layer 41 have to do with the composition and proportions of silicide layer 28 itself. For example, in certain embodiments, it was found that silicide layer 28 can be non-homogeneous. Thus, for example, tungsten silicide layer 28 can have a higher concentration of tungsten nearer the interface between the silicide layer 28 and the control gate polysilicon layer 27. This increased concentration of tungsten tends to further reduce the effectiveness of plasma 39, especially within the windows/openings having higher aspect ratios. It has also been found that the thickness of silicide layer 28 tends to vary depending upon the underlying topology. This varying thickness of suicide layer 28 can also lead to the formation of silicide residue 41 during formation.

In accordance with certain embodiments of the present invention, methods are provided for an etching process, having at least two etching stages, that overcomes the problems described above during the formation of a control gate structure by effectively removing silicide residue 41 that may form.

FIG. 4a depicts the portion of FIG. 2 following an exemplary first stage etching, in accordance with certain embodiments of the present invention. The first stage etching, which is completed in a conventional etching tool 42 (e.g., see FIG. 3), employs plasma 55 to etch away selected portions of silicide layer 28 through windows 36a, 36b and 36c, thereby forming initial etched openings 60a, 60b and 60c, respectively. As shown, initial etched openings 60a and 60b do not extend significantly (or at all) through silicide layer 28, but instead have a remaining amount 64 of silicide layer 28, therein. To the contrary, initial etched opening 60c extends substantially (or completely) through the silicide layer 28. As shown in the exemplary embodiment of FIG. 4a, initial etched opening 60c extends through the silicide layer 28 and exposes a surface 62 of control gate polysilicon layer 27. In certain other embodiments of the present invention, a portion of this underlying polysilicon layer 27 may also be etched away during the first stage etching.

FIG. 4b depicts the portion of FIG. 4a following a subsequent second stage etching, in accordance with certain embodiments of the present invention. The second stage etching is completed in etching tool 42, and employs a plasma 66 to etch away the remaining portions of silicide layer 28 (e.g., remaining amount 64) and through the exposed portions of control gate polysilicon layer 27, thereby forming etched openings 68a, 68b and 68c. As shown, etched openings 68a, 68b and 68c extend through each of the plurality of layers in layer stack 35 and expose a surface 69 of the underlying interpoly dielectric layer 24.

Plasma 66, which is employed in the second stage etching, is configured to exhibit a higher selectivity of the silicide layer 28 to polysilicon than does plasma 55, which is employed in the first stage etching. Selectivity, as used in this context, refers to a ratio of etching rates for two different layers of materials (e.g., tungsten silicide versus polysilicon) for a given plasma. Thus, for example, the selectivity for plasma 66 to silicide layer 28 versus polysilicon layer 27 is greater than about 1.2, in accordance with certain embodiments of the present invention, while the selectivity for plasma 55 is less than about 1.2. Consequently, when compared to plasma 55, plasma 66 can more rapidly etch away any residue 41 and/or remaining amount 64 within initial etched openings 60a and 60b, for example.

Plasmas 55 and 66 can be considered as having at least two contributing factors that affect the resulting etching rate for a given material. The first factor is the chemical etching capabilities of the etchant gasses, which are used to form the plasmas, with respect to the materials they contact. The second factor is the physical capabilities of the etchant gasses to remove materials upon impact (e.g., sputtering). Normally, increasing either of these factors for a given material versus another material tends to change the selectivity of the resulting plasma.

In accordance with certain embodiments of the present invention, the first and second stage etchings are completed in-situ and the same etchant chemistry is employed to generate plasmas 55 and 66. One important difference between plasma 55 and plasma 66 is that the selectivity (i.e., silicide etching rate verses polysilicon etching rate) exhibited by plasma 66 is greater than that exhibited by plasma 55 as a result of modifying the amount of electrical energy output by the source and bias power supplies, 48 and 50, respectively.

Thus, in accordance with certain exemplary embodiments of the present invention, plasmas 55 and 66 are plasmas, and are each generated using an etchant gas mixture that includes $Cl_2/N_2/He-O_2$. By way of example, for an AMAT DPS polysilicon etcher, the gas mixture for both plasmas 55 and 66 includes between about 80 and about 90 percent $Cl_2$ gas, between about 1 and about 10 percent $N_2$ gas, and between about 1 and about 10 percent $He-O_2$ gas mixture. Plasma 55 exhibits a selectivity (i.e., tungsten silicide etching rate verses polysilicon etching rate) of less than about 1.2. In the exemplary AMAT DPS etcher the selectivity is controlled below about 1.2 by maintaining the output of the source power supply 48 between about 400 and about 1,000 Watts, and the output of the bias power supply 50 between about 100 and about 200 Watts. For plasma 66, the selectivity (i.e., tungsten silicide etching rate versus polysilicon etching rate) exhibited is greater than about 1.2, and more preferably between about 1.2 and about 2.0. Thus, for example, this increase in selectivity in the AMAT DPS etcher is accomplished by maintaining the output of the source power supply 48 between about 1,500 and about 2,000 Watts, and the output of the bias power supply 50 between about 50 and about 150 Watts.

It will be recognized that different etchers will require different power supply outputs to provide the selectivities described above. The power supply outputs described above are exemplary only and configured to the AMAT DPS etcher and the etchant chemistry described in the above example.

In accordance with certain embodiments of the present invention, it was found that simply etching through silicide layer 28 and control gate polysilicon layer 27 using a single stage etching that employs a plasma exhibiting a higher selectivity (such as, for example, plasma 66) tends to produce a control gate structure having tapered sidewalls, rather than the desirable substantially vertical sidewalls 70 (as depicted in FIG. 4b). It was also found that increasing the selectivity by modifying the etchant chemistry presented additional control problems associated with the profile of the control gate structure and over/under-etching, for example, into interpoly dielectric layer 24. Therefore, it appears that the microloading effects that can to contribute to the formation of residue 41, for example, are more attributable to the lack of physical etching capability provided by plasma 55. As such, plasma 66 is configured to exhibit an increased physical etching capability that more effectively removes the remaining portions 64 of silicide layer 28 during the second stage etching.

FIG. 5 is a flowchart depicting an exemplary multistage etching process 100, in accordance with certain embodiments of the present invention. Process 100 is preferably conducted in-situ within a single etching tool 42. A first stage etching is conducted in step 102. The first stage etching employs a plasma 55 that is configured to exhibit a selectivity (i.e., tungsten silicide etching rate versus polysilicon etching rate) that is less than about 1.2. The first stage etching endpoints, in step 104, when at least one initial etched opening 60 extends to at least silicide layer 28. A second stage etching is conducted in step 106. The second stage etching employs a plasma 66 that is configured to exhibit a selectivity (i.e., tungsten silicide etching rate verses polysilicon etching rate) that is greater than about 1.2, and more preferably between about 1.2 and about 2.0. The second stage etching endpoints, in step 108, when etched openings 68 extend through silicide layer 28 and control gate polysilicon layer 27 to expose underlying interpoly dielectric layer 24. Plasma 66 is also configured to exhibit an adequately high selectivity of polysilicon etching rate versus interpoly dielectric etching rate, to significantly reduce the potential of over-etching into the interpoly dielectric layer 24.

Alternatively, in step 110, the second stage etching endpoints when the etched openings 68 extend through silicide layer 28. Next, in step 112, a third stage etching, which employs substantially the same plasma as the first stage etching (step 102), is conducted to continue etching through control gate polysilicon layer 27. Next, in step 108, the third stage etching endpoints on the interpoly dielectric layer 24.

Although the present invention has been described and illustrated in detail, it is to be clearly understood that the same is by way of illustration and example only and is not be taken by way of limitation, the spirit and scope of the present invention being limited only by the terms of the appended claims.

What is claimed is:

1. A method for fabricating a semiconductor device, the method comprising:

forming a first gate structure on a substrate;

forming at least one dielectric material on the first gate structure;

forming a layer stack on the dielectric material, the layer stack comprising a second gate material that is formed on the dielectric material and a silicide that is formed on the second gate material;

selectively removing a portion of the layer stack using a first plasma followed by a second plasma to expose a portion of the underlying dielectric material, wherein the same etchant chemistry is employed to generate the first plasma and the second plasma, and wherein a power supply is adjusted such that the second plasma exhibits a higher selectivity of the silicide to polysilicon than the first plasma.

2. The method as recited in claim 1, wherein the second gate material comprises polysilicon.

3. The method as recited in claim 2, wherein the silicide comprises tungsten silicide.

4. The method as recited in claim 3, wherein the first plasma exhibits an etching rate selectivity of tungsten silicide to polysilicon of less than about 1.2.

5. The method as recited in claim 4, wherein the second plasma exhibits an etching rate selectivity of tungsten silicide to polysilicon greater than about 1.2.

6. The method as recited in claim 5, wherein the second plasma exhibits an etching rate selectivity of tungsten silicide to polysilicon of between about 1.2 and about 2.0.

7. The method as recited in claim 3, wherein the step of selectively removing a portion of the layer stack using a first plasma followed by a second plasma is conducted in-situ using an etching tool having an adjustable source power supply and an adjustable bias power supply, the method further comprising the step of adjusting at least one of the source power supply and bias power supply to generate the second plasma from the first plasma.

8. The method as recited in claim 7, further comprising configuring the source power supply to supply between about 400 and about 1,000 Watts of electrical energy to the etching tool, and the bias power supply to supply between about 100 and about 200 Watts of electrical energy to the etching tool to generate the first plasma.

9. The method as recited in claim 7, further comprising configuring the source power supply to supply between about 1,500 and about 2,000 Watts of electrical energy to the etching tool and the bias power supply to supply between about 50 and about 150 Watts of electrical energy to the etching tool to generate the second plasma.

10. The method as recited in claim 7, wherein the first and second plasmas are each generated within the etching tool using an etchant chemistry.

11. The method as recited in claim 10, wherein the etchant chemistry comprises a mixture of $Cl_2/N_2/He-O_2$ gasses.

12. The method as recited in claim 11, wherein the etchant chemistry comprises between about 80 and about 90 percent $Cl_2$ gas, between about 1 and about 10 percent $N_2$ gas, and between about 1 and about 10 percent $He-O_2$ gas mixture.

13. The method as recited in claim 1, wherein the step of selectively removing a portion of the layer stack using a first plasma followed by a second plasma, includes selectively removing at least a first portion of the silicide using the first plasma and selectively removing a second portion of the silicide using the second plasma to expose a portion of the underlying second gate material.

14. The method as recited in claim 1, wherein the layer stack further includes at least one layer of materials, selected from a set of materials including polysilicon, silicon dioxide, silicon nitride, and silicon oxynitride, over the silicide.

15. A method for etching through a silicide during fabrication of a semiconductor device, the method comprising:

first etching into selected portions of a silicide at a first etching rate; and then second etching through the silicide at a second etching rate, which is faster than the first etching rate, wherein the same etchant chemistry is employed during the first and second etching.

16. The method as recited in claim 15, wherein the silicide comprises tungsten.

17. An in-situ multistage etching method for removing silicide in a semiconductor device during fabrication within an etching tool, the method comprising:

first etching the silicide at a first rate during a first stage;

adjusting an amount of electrical energy provided to an etchant mechanism generated within the etching tool to raise the etching rate to a second rate higher than the first rate; and second etching the silicide at the second rate during a second stage, wherein the same etchant chemistry is employed during the first and second etching.

18. The in-situ multistage etching method as recited in claim 17, wherein the silicide is located on a layer of polysilicon and the step of etching the silicide at the second rate during a second stage further comprises etching through the layer of polysilicon during the second stage.

19. The in-situ multistage etching method as recited in claim 17, wherein the silicide is located on a layer of polysilicon and the step of etching the silicide at the the second rate during a second stage further comprises etching through the silicide during the second stage, and the method further comprises etching the layer of polysilicon during the third stage.

* * * * *